(12) United States Patent
Ogawa

(10) Patent No.: US 6,711,452 B1
(45) Date of Patent: Mar. 23, 2004

(54) SEMICONDUCTOR EXPOSURE APPARATUS AND PARAMETER CHECK METHOD

(75) Inventor: Osamu Ogawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 458 days.

(21) Appl. No.: 09/610,370

(22) Filed: Jul. 5, 2000

(30) Foreign Application Priority Data

Jul. 5, 1999 (JP) ............................................. 11-190421

(51) Int. Cl.[7] ........................ G06F 19/00; G06F 9/445
(52) U.S. Cl. ........................ 700/121; 700/87; 717/125; 717/168
(58) Field of Search ........................ 700/86, 87, 96, 700/117, 121; 717/113, 120, 121, 122, 124–126, 168–170, 174, 175

(56) References Cited

U.S. PATENT DOCUMENTS

| | | | | |
|---|---|---|---|---|
| 5,247,683 A | * | 9/1993 | Holmes et al. ............. | 717/131 |
| 5,432,942 A | * | 7/1995 | Trainer ...................... | 709/221 |
| 5,469,361 A | * | 11/1995 | Moyne ...................... | 717/131 |
| 5,838,563 A | * | 11/1998 | Dove et al. ................. | 700/95 |
| 5,903,455 A | * | 5/1999 | Sharpe et al. ............... | 700/83 |
| 6,367,077 B1 | * | 4/2002 | Brodersen et al. .......... | 717/170 |
| 6,415,193 B1 | * | 7/2002 | Betawar et al. .............. | 700/97 |
| 6,442,446 B1 | * | 8/2002 | Nakamura et al. .......... | 700/121 |
| 6,499,007 B1 | * | 12/2002 | Kuroki et al. ............... | 703/22 |
| 6,618,853 B1 | * | 9/2003 | Ohyama et al. ............. | 717/109 |

* cited by examiner

Primary Examiner—Leo Picard
Assistant Examiner—Paul Rodriguez
(74) Attorney, Agent, or Firm—Fitzpatrick, Cella, Harper & Scinto

(57) ABSTRACT

An apparatus adapted for exposing a semiconductor is controlled by a program using a plurality of parameters. The apparatus has an extraction device that extracts a parameter, from the plurality of parameters, of which a settable range is changed due to an upgrade of the program. An edit device edits a value of an extracted parameter extracted by the extraction device.

17 Claims, 7 Drawing Sheets

SEMICONDUCTOR EXPOSURE APPARATUS AND PARAMETER CHECK METHOD

FIELD OF THE INVENTION

The present invention relates to a semiconductor exposure apparatus and a parameter check method therefor.

BACKGROUND OF THE INVENTION

A semiconductor exposure apparatus uses a large number of parameters necessary for controlling the apparatus, and these parameters are managed in a database. The software for operating the apparatus based on the parameters is often upgraded to, e.g., add functions. Since several functions are added and changed for a new version in upgrading software, parameters are also added and changed. Hence, in upgrading software, parameters also undergo conversion processing (upgrading) from an old database to a new one. If the parameters are not properly updated, the apparatus does not correctly operate. When the effective range of a parameter value or the like is changed in the new version, an appropriate value must be input again for the parameter after upgrading the parameter database.

FIG. 2 is a flow chart showing general upgrading processing.

The exposure program is upgraded in step 201, and that of the parameter database is upgraded in step 202. The exposure program is activated in step 203, and an editor (parameter editor) for editing parameters is activated in step 204. Parameters described in an upgrading manual or the like that should be changed are referred to in step 205. If the presence of an uncorrected parameter is determined in step 206, the parameter is corrected in step 207.

In this manner, the conventional semiconductor exposure apparatus does not have any means for automatically determining and correcting a parameter whose effective range or the like has been changed. Thus, parameters must be listed on an upgrading manual or the like. The operator must correct these parameters with a parameter editor after upgrading while referring to the manual.

However, since the operator corrects parameters while referring to a manual, this increases the number of factors such as a decrease in working efficiency, generation of dust, and an input error which causes the malfunction of the apparatus. Also, a parameter correction failure causes the malfunction of the apparatus.

SUMMARY OF THE INVENTION

The present invention has been made in consideration of the conventional situation, and has as its object to increase the working efficiency in the parameter correction work, to decrease the generation of dust or extraneous small particles, and to prevent any input error without referring to any upgrading manual or the like in correcting parameters.

To achieve the above object, according to one aspect of the present invention, there is provided a semiconductor exposure apparatus controlled by exposure software using a plurality of parameters. This apparatus comprises extraction means for extracting parameter values falling outside settable ranges after upgrading when the exposure software is upgraded, and storage means for storing information of the parameters extracted by the extraction means. This arrangement can greatly reduce the labor of the operator for searching for a parameter while referring to an upgrading manual or the like.

The parameter information stored in the memory means is information necessary for resetting parameters. For example, a name for identifying a parameter, the set value of the parameter, and a settable value for the parameter after upgrading are stored as a file.

To increase the correction efficiency, the apparatus may comprise edit means for automatically displaying the stored parameter information on an edit window in activating the exposure software. Since the edit window of parameters which must be corrected is displayed in activating the exposure software, parameter edit processing can always be performed before the start of exposure processing.

In updating the set value of the parameter on the edit window, only a settable value for the parameter is allowed to be input, which prevents any malfunction of the semiconductor exposure apparatus caused by a parameter setting error. By deleting, from a file, only information of a parameter whose set value has been updated, the set value that the user forgets to update can be checked.

According to another aspect of the present invention, there is provided a method for checking and editing parameters in a semiconductor apparatus. This method is a semiconductor exposure method controlled by exposure software using a plurality of parameters, comprising the extraction step of extracting parameter values falling outside settable ranges after upgrading when the exposure software is upgraded, and the storage step of storing, in a storage medium, information of the parameters extracted in the extraction step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

A preferred embodiment of the present invention will now be described in detail in accordance with the accompanying drawings.

Figure 1:
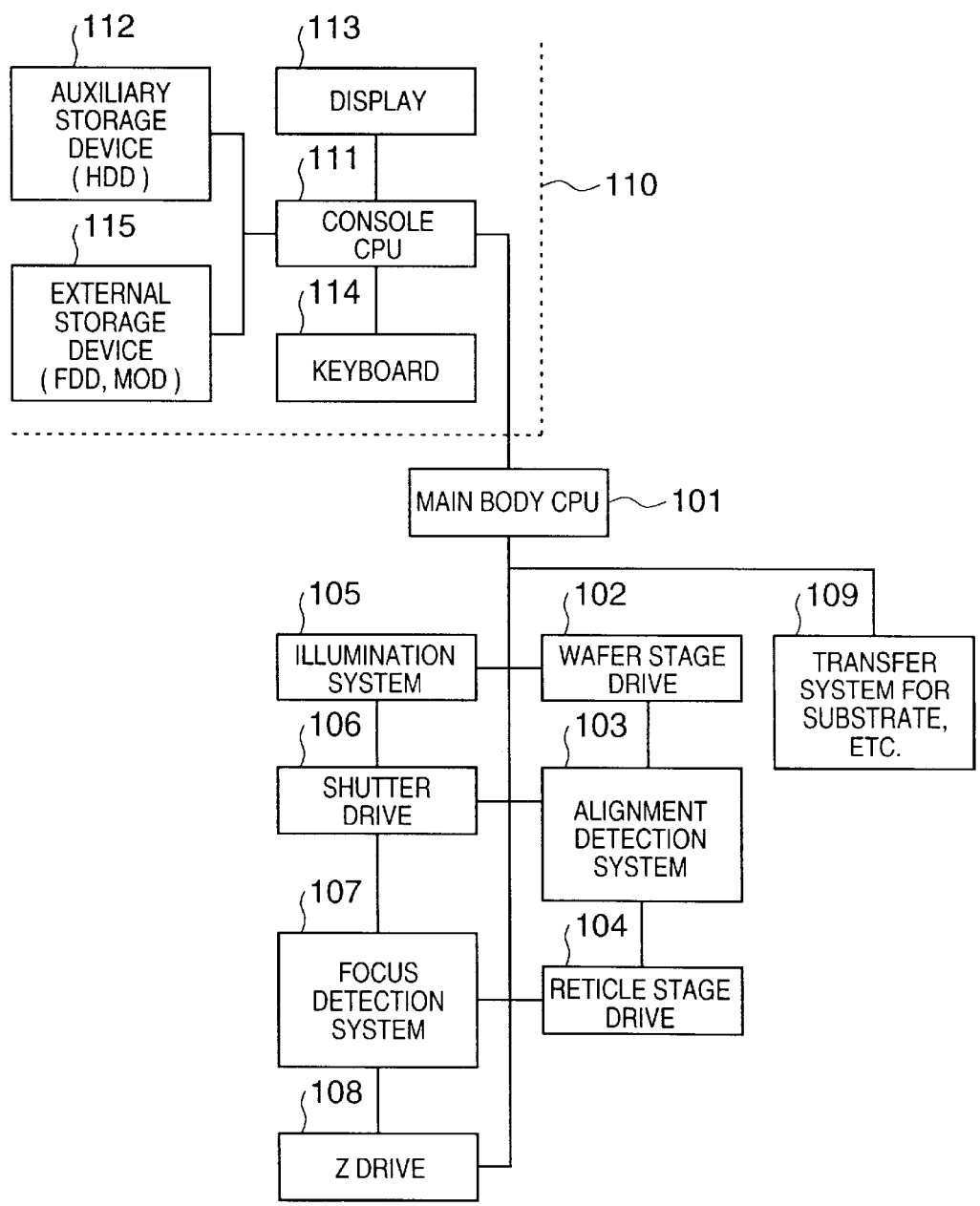
FIG. 1 is a block diagram showing the schematic arrangement of a semiconductor exposure apparatus according to an embodiment of the present invention.
Figure 2:
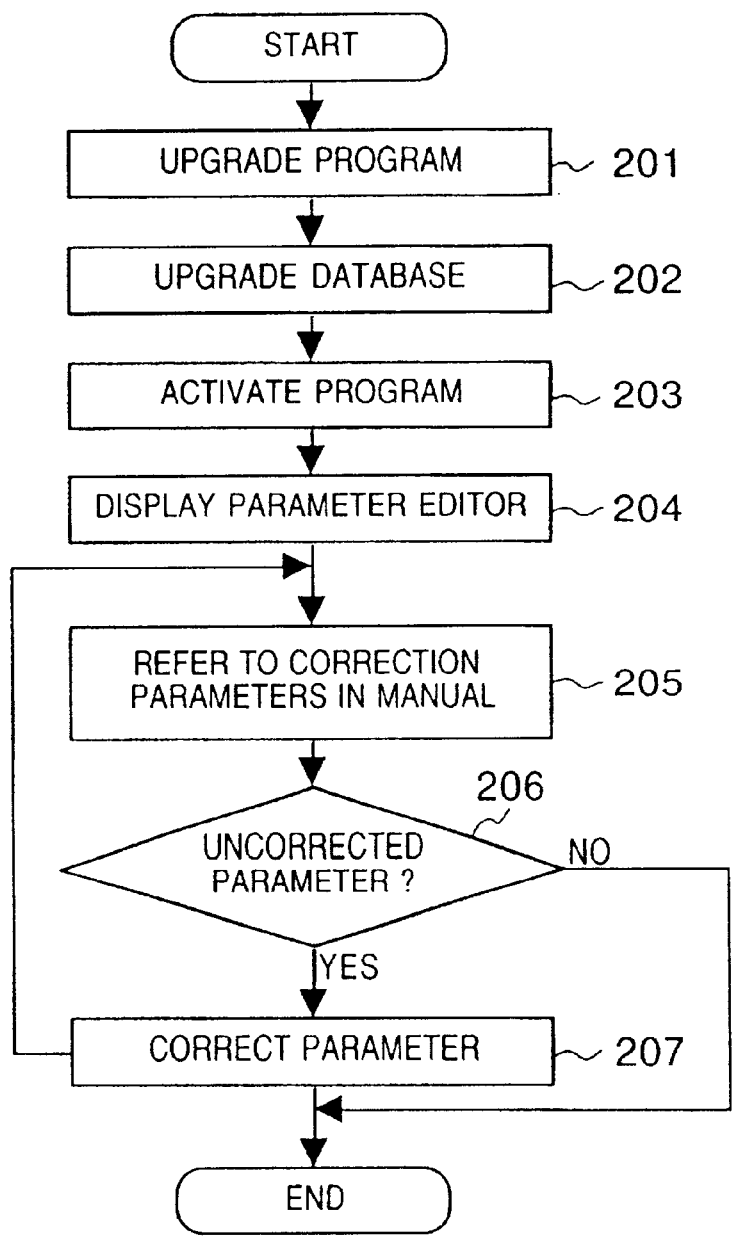
FIG. 2 is a flow chart showing the outline of operation of a conventional parameter check method.

FIG. 1 is a block diagram showing the arrangement of an exposure apparatus according to an embodiment of the present invention. FIG. 1 is a block diagram showing a semiconductor exposure apparatus for exposing a wafer on a wafer stage via a reticle pattern on a reticle stage, and drawing the reticle pattern on the wafer. In FIG. 1, reference numeral 101 denotes a main body CPU for controlling the whole apparatus, which is a central processing unit made of a microcomputer or minicomputer; 102, a wafer stage drive; 103, an alignment detection system such as an off-axis microscope; 104, a reticle stage drive; 105, an illumination system such as a light source; 106, a shutter drive; 107, a focus detection system; and 108, a Z drive. The wafer stage drive 102, alignment detection system 103, reticle stage drive 104, illumination system 105, shutter drive 106, focus detection system 107, and Z drive 108 are controlled by the main body CPU 101. Reference numeral 109 denotes a transfer system including a reticle transfer device and wafer transfer device.

Reference numeral 110 denotes a console unit having a console CPU 111, auxiliary storage device 112, display 113, keyboard 114, and external storage device 115. The console unit 110 is used to supply various commands and parameters concerning the operation of the exposure apparatus to the main body CPU 101. That is, the console unit 110 is used to exchange information between the main body CPU 101 and the operator.

The auxiliary storage device 112 is, e.g., a hard disk, in which a database is constructed to store various parameters and their management data. The external storage device 115 includes an FDD (Floppy Disk Drive) and an MOD (Magneto-Optical disk Drive).

In this embodiment, programs and data stored in a medium such as a floppy disk or magneto-optical disk are read out from the external storage device 115, and stored in the auxiliary storage device 112. Then, the programs and data are used after being loaded to the main memory (not shown) of the console CPU 111.

Figure 3:
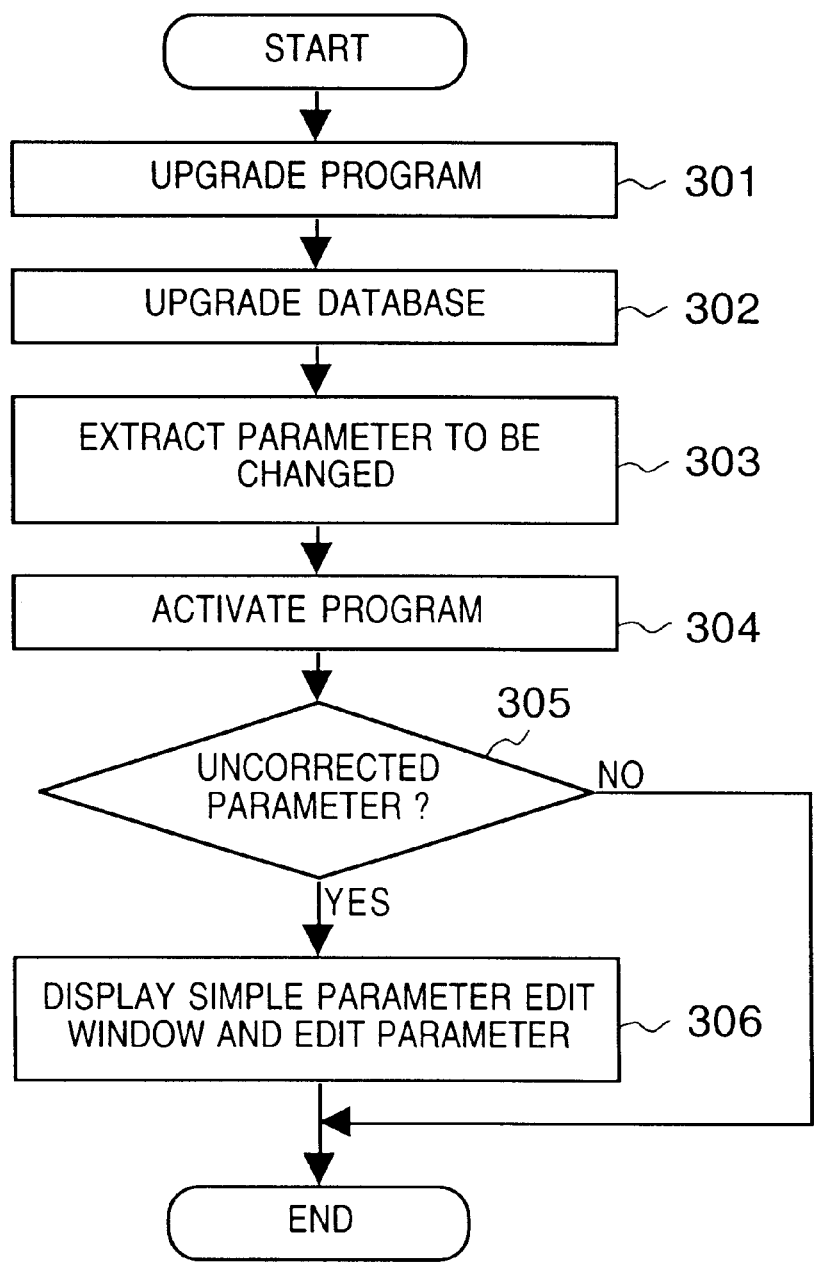
FIG. 3 is a flow chart showing the outline of operation of a parameter check method according to the embodiment of the present invention.

FIG. 3 is a flow chart showing upgrading processing in this embodiment. This processing is executed in the console unit 110 of FIG. 1. Note that a control program for realizing the processing by the console CPU 111 is stored in the auxiliary storage device 112, and loaded to the main memory, as needed.

In step 301, the exposure program is upgraded. If the software is upgraded, parameters in a database necessary for the software must be added, deleted, and changed into new contents (conversion processing). For this purpose, the parameter database is upgraded (conversion processing) in step 302. In step 303, a parameter whose effective range or the like has been changed so that the set value before upgrading falls outside the effective range is extracted. In step 304, the exposure program is activated. If the presence of a parameter extracted in step 303 is determined in step 305, an editor dedicated to the extracted parameter is activated to edit the parameter in step 306.

This embodiment adopts automatic parameter extraction processing in step 303, automatic activation processing for a simple parameter edit window in step 305, and simple parameter edit processing in step 306. This can increase the efficiency, decrease dust, and prevent any input error without referring to any manual describing parameters to be changed.

Figure 4:
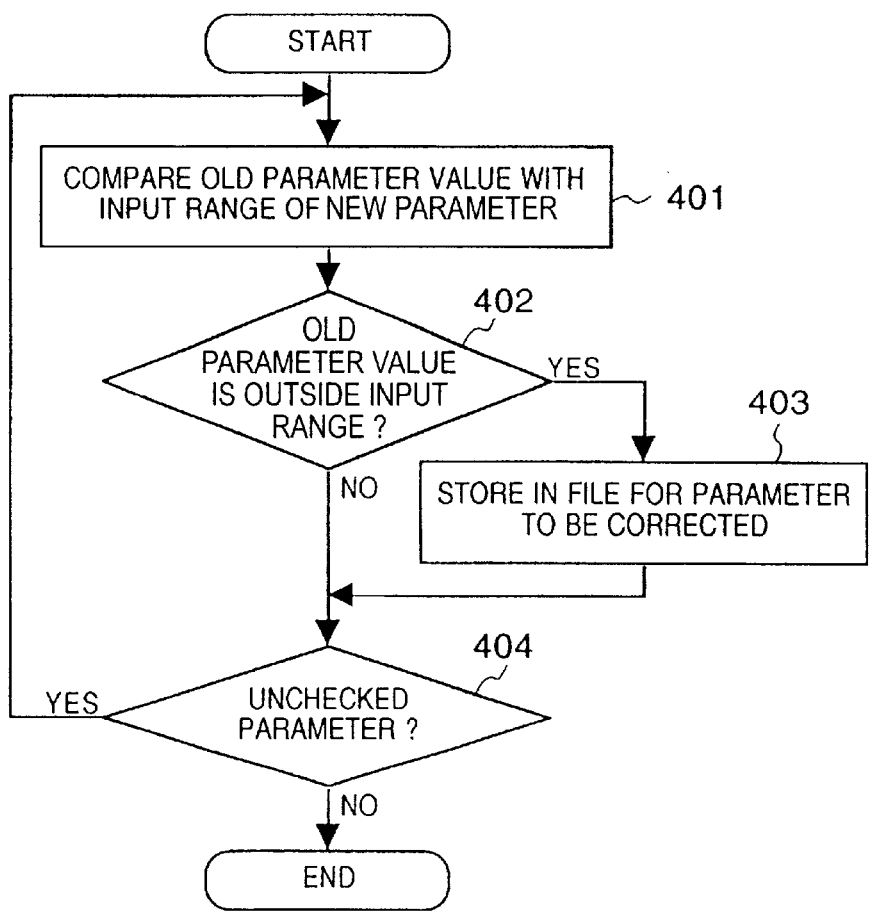
FIG. 4 is a flow chart showing the process of an automatic parameter extraction means.

FIG. 4 is a flow chart showing processing (automatic parameter extraction processing) in step 303 of FIG. 3 in detail.

After the database is upgraded, a parameter value (old parameter value) set in an old version is compared with the input range of a corresponding parameter in the new version in step 401. If the old parameter value is determined to fall outside the input range (YES in step 402), the parameter information is stored in a file, and the processing shifts to step 404. The file generated in step 403 is stored in the auxiliary storage device 112. If NO in step 402, the processing directly shifts to step 404. In step 404, whether an unchecked parameter exists is determined. If YES in step 404, the processing returns to step 401 and is repeated. If NO in step 404, the processing ends.

By the series of processes, all parameters having different input ranges are stored in the file.

Figure 7:
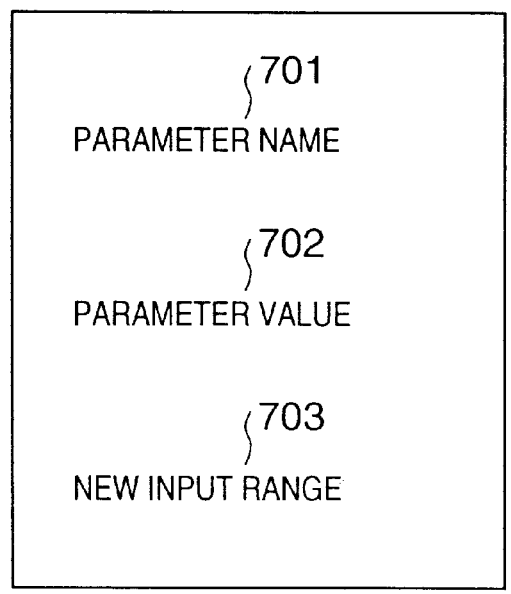
FIG. 7 is a view showing the format of a parameter record file.

A file holding parameters whose input ranges have been changed registers parameter data, which should be changed, and each parameter data is made up of a parameter name 701, a parameter value 702 in an old version, and a new input range 703, as shown in FIG. 7. For example, parameter A has a value "30" in an old version. When the input version changes to "0 to 20" in the new version, "A", "30", and "0 to 20" are recorded as the parameter name 701, parameter value 702, and new input range 703, respectively. In this case, parameter A must be changed to a proper value within the range of 0 to 20; otherwise, the apparatus may malfunction.

Figure 5:
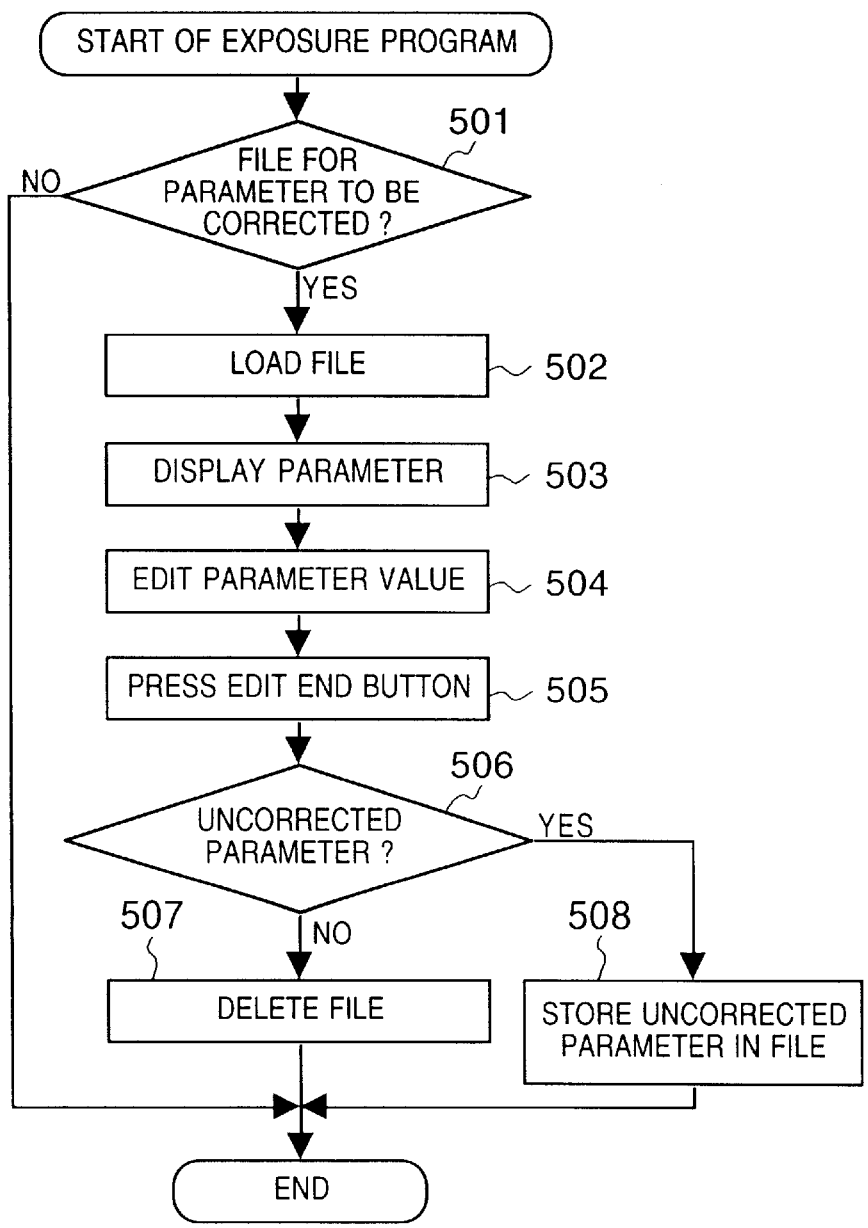
FIG. 5 is a flow chart showing the processes of a simple edit activation means and simple edit means.

FIG. 5 is a flow chart showing processing (simple edit activation processing) of step 305 and processing (simple edit processing) of step 306 in FIG. 3 in detail.

Whether a file generated in automatic parameter extraction processing of step 403 in FIG. 4 exists is checked in step 501. If NO in step 501, the processing ends. If YES in step 501, the processing shifts to step 502 to load the file, and shifts to step 503. In step 503, parameters stored in the file are displayed on the display (see FIG. 6) to present parameters to be updated to the user and to prompt the user to update the parameter values. Steps 504 and 505 show the operation of the user. In step 504, the user inputs again a displayed parameter value 601, and presses an input completion button 602 upon completion of the input. If the user presses a parameter edit end button 604 in step 505, the processing progresses to step 506. If all the displayed parameters are determined in step 506 to be corrected (the input completion buttons 602 of all the parameters are determined to be pressed), the processing shifts to step 507 to delete the displayed file, and then ends. If the presence of an uncorrected parameter is determined in step 506 (the input completion button 602 has not been pressed), a file holding only the uncorrected parameter is overwritten on the corresponding file in step 508.

More specifically, the file generated in step 403 is left without being deleted unless all the parameters in the file generated in automatic parameter extraction processing of step 403 in FIG. 4 are corrected. In activating the exposure program, the parameter correction window is always displayed upon determination in step 501, thereby preventing any malfunction of the apparatus caused when the user forgets to correct a parameter.

Figure 6:
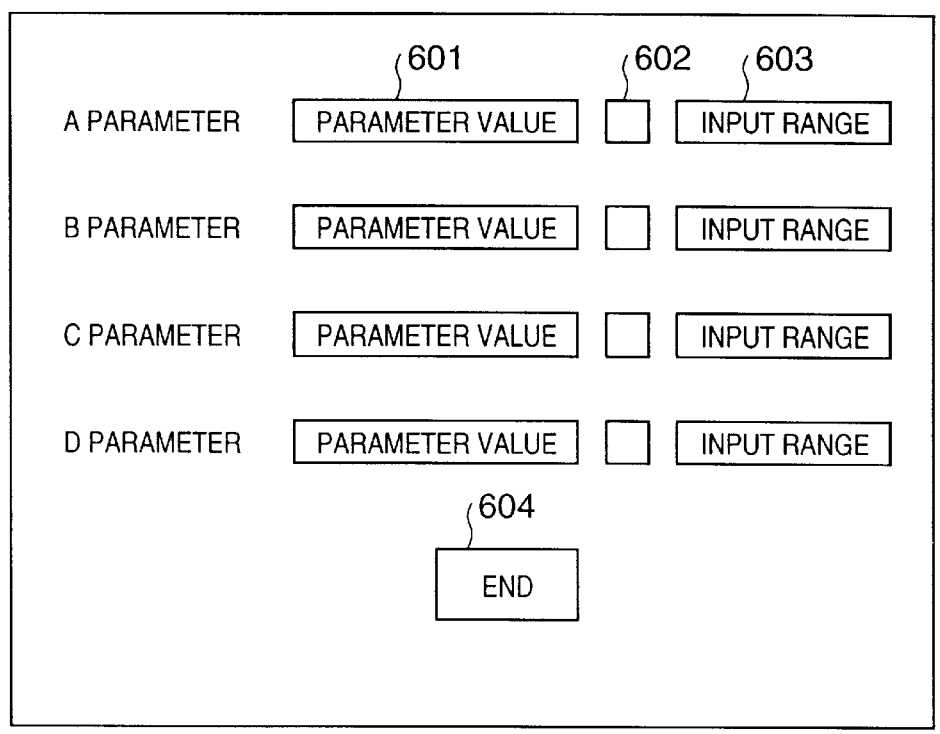
FIG. 6 is a view showing a simple edit window.

FIG. 6 shows a simple edit window displayed in step 503. This window displays parameters stored in the file generated in step 403 so as to correct their parameter values.

In FIG. 6, a field 601 is used to display and input a parameter value. In activating the window, parameter values stored in the file generated in step 403 are displayed. The user inputs a corrected value in this window, and presses the input completion button 602 after completion of the input, thereby fixing the changed parameter value. A field 603 displays the current input range of a parameter (input range after upgrading which is a value stored as the new input range 703 in FIG. 7). The user can input a parameter value in the field 601 while referring to the input range displayed in the field 603. The input field 601 allows inputting only a value falling within the input range 603 so as to more effectively prevent any input error. If the user presses the edit end button 604, the edit window ends.

As has been described above, the present invention adopts automatic parameter extraction processing, dedicated-editor activation processing, and simple edit processing. The present invention can, therefore, increase the efficiency, decrease dust, and prevent any input error without referring to any manual in correcting parameters along with upgrading of software in the exposure apparatus.

As many apparently widely different embodiments of the present invention can be made without departing from the spirit and scope thereof, it is to be understood that the invention is not limited to the specific embodiments thereof except as defined in the appended claims.

What is claimed is:

1. An apparatus which exposes a semiconductor and is controlled by a program using a plurality of parameters, said apparatus comprising:

extraction means for extracting a parameter, from the plurality of parameters, of which a settable range is changed due to an upgrade of the program; and edit means for editing a value of an extracted parameter extracted by said extraction means.

2. An apparatus according to claim 1, wherein the settable range is a numerical range which can be taken by one of the plurality of parameters.

3. An apparatus according to claim 1, wherein said edit means displays information of the extracted parameter on a display.

4. An apparatus according to claim 1, wherein said edit means inhibits input of a content, for the extracted parameter, falling outside the settable range after the upgrade of the program.

5. An apparatus according to claim 1, wherein said extraction means generates for the extracted parameter, a file which includes a name for identifying the extracted parameter, a current set value of the extracted parameter, and the settable range of the extracted parameter after the upgrade of the program, and said apparatus further comprises storage means for storing the file generated by said extraction means.

6. An apparatus according to claim 5, wherein said edit means deletes, from said storage means, the file corresponding to the extracted parameter of which a content has been updated.

7. An apparatus according to claim 1, further comprising storage means for storing information of the extracted parameter, and wherein said edit means is activated if the information of the extracted parameter exists in said storage means.

8. An apparatus according to claim 7, wherein said edit means is activated in activating the upgraded program.

9. A method adapted to an apparatus for exposing a semiconductor, which is controlled by a program using a plurality of parameters, said method comprising steps of:

extracting a parameter, from the plurality of parameters, of which a settable range is changed due to an upgrade of the program; and editing a value of an extracted parameter extracted in said extraction step.

10. A method according to claim 9, wherein the settable range is a numerical range which can be taken by one of the plurality of parameters.

11. A method according to claim 9, wherein in said extraction step, a file is generated, for the extracted parameter, which includes a name for identifying the extracted parameter, a current set value of the extracted parameter, and the settable range of the extracted parameter after the upgrade of the program, and said method further comprises a step of storing the file generated in said extraction step in storage means of the apparatus.

12. A method according to claim 9, further comprising a step of storing information of the extracted parameter in storage means of the apparatus, and wherein said editing step is performed if the information of the extracted parameter is stored in the storage means.

13. A method according to claim 9, wherein, in said editing step, information of the extracted parameter is displayed on a display.

14. A method according to claim 9, wherein, in said editing step, input of a content, for the extracted parameter, falling outside the settable range after the upgrade of the program, is inhibited.

15. A method according to claim 11, wherein, in said editing step, the file corresponding to the extracted parameter of which a content has been updated is deleted from the storage means.

16. A method according to claim 12, wherein said editing step is performed in activating the upgraded program.

17. A computer-readable storage medium storing a program which causes a computer to execute a method adapted to an apparatus for exposing a semiconductor, the apparatus being controlled by the program using a plurality of parameters, the method comprising steps of:

extracting a parameter, from the plurality of parameters, of which a settable range is changed due to a program upgrade to the program; and editing a value of a parameter extracted in said extraction step.

* * * * *